(12) United States Patent
Jin et al.

(10) Patent No.: US 11,228,018 B2
(45) Date of Patent: Jan. 18, 2022

(54) ORGANIC LIGHT-EMITTING DISPLAY PANEL AND FABRICATING METHOD

(71) Applicants: Shanghai Tianma AM-OLED Co., Ltd., Shanghai (CN); Tianma Micro-Electronics Co., Ltd., Shenzhen (CN)

(72) Inventors: Jian Jin, Shanghai (CN); Congyi Su, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 346 days.

(21) Appl. No.: 15/478,680

(22) Filed: Apr. 4, 2017

(65) Prior Publication Data
US 2017/0207419 A1 Jul. 20, 2017

(30) Foreign Application Priority Data
Dec. 28, 2016 (CN) .......................... 201611237139.3

(51) Int. Cl.
*H01L 51/52* (2006.01)
*C09D 183/04* (2006.01)
*C09D 183/08* (2006.01)
*C08G 77/20* (2006.01)
*C08G 77/28* (2006.01)

(52) U.S. Cl.
CPC ........ *H01L 51/5253* (2013.01); *C09D 183/04* (2013.01); *C09D 183/08* (2013.01); *C08G 77/20* (2013.01); *C08G 77/28* (2013.01)

(58) Field of Classification Search
CPC .................................................. H01L 51/5253
See application file for complete search history.

(56) References Cited

U.S. PATENT DOCUMENTS

| | | | | |
|---|---|---|---|---|
| 2006/0081864 A1* | 4/2006 | Nakazawa | .............. | C08L 83/04 257/98 |
| 2012/0313136 A1* | 12/2012 | Chung | ................ | H01L 51/5253 257/100 |
| 2014/0132892 A1* | 5/2014 | Ko | .......................... | H01L 33/56 349/69 |

FOREIGN PATENT DOCUMENTS

| | | |
|---|---|---|
| CN | 1720282 A | 1/2006 |
| CN | 102702987 A | 10/2012 |
| CN | 103943786 A | 7/2014 |
| CN | 104064674 A | 9/2014 |
| CN | 104903384 A | 9/2015 |
| WO | 2015193554 A1 | 12/2015 |

\* cited by examiner

*Primary Examiner* — Kenneth Parker
*Assistant Examiner* — Christopher A Culbert
(74) *Attorney, Agent, or Firm* — Anova Law Group, PLLC

(57) ABSTRACT

An organic light-emitting display panel and a fabrication method thereof are provided. The organic light-emitting display panel comprises a substrate; an organic light-emitting device disposed on a side of the substrate, wherein the organic light-emitting device has a first side facing the substrate and an opposing side; and an encapsulation layer disposed on the opposing side of the organic light-emitting device. The encapsulation layer includes at least one organic encapsulation layer, and the at least organic encapsulating layer has a polymer network of cross-linked polyorganosiloxane.

13 Claims, 6 Drawing Sheets

ORGANIC LIGHT-EMITTING DISPLAY PANEL AND FABRICATING METHOD

CROSS-REFERENCES TO RELATED APPLICATIONS

This application claims priority of Chinese Patent Application No. 201611237139.3, filed on Dec. 28, 2016, the entire contents of which are hereby incorporated by reference.

FIELD OF THE INVENTION

The present disclosure generally relates to the field of display panel design, and, more particularly, relates to an organic light-emitting display panel and a fabricating method thereof, and, more particularly, relates to an organic light-emitting display panel including a specific encapsulation layer and a fabricating method thereof.

BACKGROUND

Thin film encapsulation (TFE) encapsulates organic light-emitting diodes (OLEDs) having rigid substrates or flexible substrates (e.g. PEN, PES, PC, PET plastic substrates). Especially for OLEDs having flexible substrates, TFE enables flexibility and rotatability of flexible OLEDs. Existing TEE structures for encapsulating OLED devices often have an inorganic film organic film stack configuration, which may include three layers, five layers, or even more layers. In particular, the inorganic film mainly blocks moisture and oxygen from an outside environment, while the organic film often flattens the surface, releases the stress and increases the moisture and oxygen permeation path.

As flexible devices gain more and more attention, the requirements for flexible packaging or encapsulation become higher and higher. Several issues in the existing TFE technology are highly desired to be resolved, such as substantially thick inorganic film, poor performance of the organic material (e.g., acrylic acid) in the organic film, substantially weak adhesion between the organic film and the inorganic film, and water absorption of the acrylic acid, etc.

The disclosed organic light-emitting display panel and fabricating method thereof are directed to solve one or more problems set forth above and other problems.

BRIEF SUMMARY OF THE DISCLOSURE

One aspect of the present disclosure provides an organic light-emitting display panel. The organic light-emitting display panel comprises a substrate; an organic light-emitting device disposed on a side of the substrate, wherein the organic light-emitting device has a first side facing the substrate and an opposing side; and an encapsulation layer disposed on the opposing side of the organic light-emitting device. The encapsulation layer includes at least one organic encapsulation layer, and the at least organic encapsulating layer has a polymer network of cross-linked polyorganosiloxane.

Another aspect of the present disclosure provides a method for fabricating an organic light-emitting display panel. The method comprises providing a substrate; forming an organic light-emitting device on the substrate, wherein the organic light-emitting device has a first side facing the substrate and an opposing side; and coming an encapsulation layer including at least one organic encapsulation layer on the opposing side of the organic light-emitting device, wherein the encapsulation layer includes at least one organic encapsulation layer, and the at least organic encapsulating layer has a polymer network of cross-linked polyorganosiloxane. Forming the encapsulation layer on the opposing side of the organic light-emitting device further includes: inkjet printing a material for forming the polymer network of the cross-linked polyorganosiloxane; and photo-curing the material.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
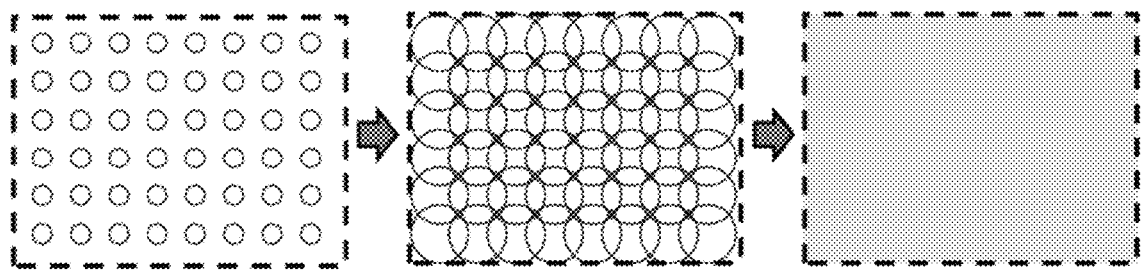
FIG. 1 illustrates an existing inkjet printing process.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like pans, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present invention. Based on the disclosed embodiments, persons of ordinary skill in the art may derive other embodiments consistent with the present disclosure, all of which are within the scope of the present disclosure.

As discussed in the background, the inorganic film mainly blocks moisture and oxygen from an outside environment. The organic film capable of flattening a surface often covers particles and stages of the thin film transistor (TFT) substrate. The organic film capable of releasing the stress also eliminates the stress generated by an adjacent inorganic film. The organic film is also able to increase the moisture and oxygen permeation path. When a substantially thick organic film is disposed between two inorganic films, the moisture and oxygen permeation path may be increased accordingly.

As the requirements for flexible packaging become higher and higher, several problems in the existing TFE technology are highly desired to be resolved. For example, the inorganic film is substantially thick, which may bring challenges to realize flexible devices. Defects and particles are often generated in the existing inorganic film production process, which may degrade the moisture and oxygen barrier properties of the inorganic film.

The performance of the organic material (e.g., acrylic acid) in the organic film is highly desired to be improved, such as UV shrinkage, outgassing, thermal expansion, and film yellowing. The adhesion between the organic film (e.g., acrylic acid) interface and the inorganic layer is substantially weak, and the film may be easy to fall off. The acrylic acid materials absorb water easily, which may lead to high requirements on the process environment.

Figure 2:
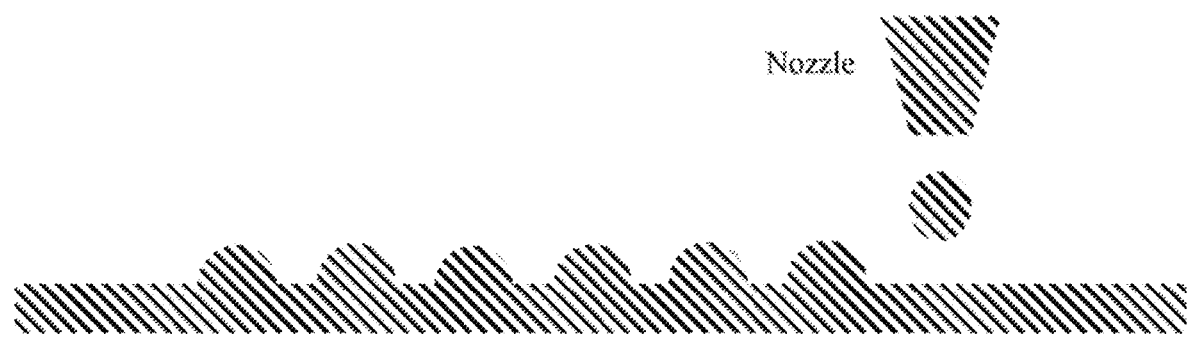
FIG. 2 illustrates a printing step in an existing inkjet printing process.

FIG. 1 illustrates an existing inkjet printing process (IJP). FIG. 2 illustrates a printing step in an existing inkjet printing process. As shown in FIG. 1, the existing inkjet printing process includes a printing step, a leveling step and a curing step. In the printing step, a plurality of ink droplets are printed on a target, thereby firming an image. In particular, as shown in FIG. 2, in the printing step, ink droplets are ejected onto a substrate through a printing nozzle. Returning to FIG. 1, in the leveling step, the ink droplets flow together to form a continuous liquid film. In the curing step, the continuous liquid film is cured under ultraviolet (UV) irradiation to form a solid organic layer.

Thus, an organic encapsulating material, which is capable of encapsulating the display panel by the inkjet printing process and providing improved encapsulation of the display panel, is highly desired.

The present disclosure provides an organic light-emitting display panel, which may be encapsulated by the inkjet printing process. The encapsulation process may be simplified, while the reliability the display panel may be improved.

In practical applications, gases (e.g., oxygen) or liquid (e.g., water) may invade the interior of the organic light-emitting display panel, which may degrade the performance of the organic light-emitting display panel. To prevent the performance degradation, the present, disclosure an improved organic light-emitting display panel, which may comprise a substrate, an organic light-emitting device disposed on one side of the substrate, and an encapsulation layer disposed on one side of the organic light-emitting device far away from the substrate.

In particular, the encapsulation layer may comprise at least one organic encapsulation layer, and the at least organic encapsulating layer may have a polymer network formed by the crosslink of polyorganosiloxane. That is, the at least organic encapsulating layer may have a polymer network formed by the cross-linked polyorganosiloxane.

The siloxane bond of the polyorganosiloxane has a larger angle than carbon-carbon bond, leading, to an easy rotation. The angle of the adjacent siloxane bonds may be changed. Thus, the formed polymer may have a degree of elasticity and toughness and, further, the encapsulation layer based on the polyorganosiloxane may be more suitable for flexible organic light-emitting display panels.

When no other definition is provided, the term "substituted" used herein means that the hydrogen of the compound is substituted with at least one of the following groups: halogen (F, Cl, Br or I), hydroxy, alkoxy, nitro, cyano, amino, azido, amidino, nitrile, carbonyl, carbamoyl, thiol, ester, carboxyl or salt thereof, sulfonic acid group or salt thereof, phosphoric acid group or salt thereof, $C_1$ to $C_{30}$ alkyl, $C_2$ to $C_{20}$ alkenyl group, $C_2$ to $C_{20}$ alkynyl group, $C_6$ to $C_{30}$ aryl, $C_7$ to $C_{20}$ aralkyl, $C_1$ to $C_8$ alkoxy group, $C_3$ to $C_{20}$ heteroaryl, and $C_3$ to $C_{30}$ cycloalkyl.

When no other definition is provided, the term "miscellaneous" as used herein refers to 1 to 3 nitrogen atoms, oxygen atoms, sulfur atoms or phosphorus atoms.

Figure 3:
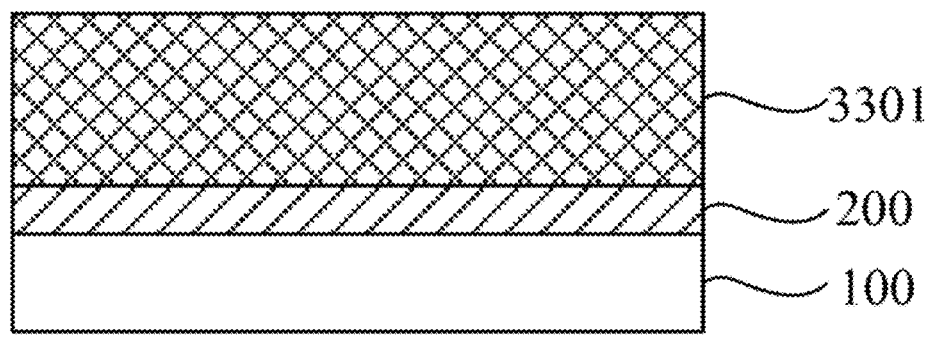
FIG. 3 illustrates a cross-sectional view of an exemplary organic light-emitting display panel consistent with disclosed embodiments.

FIG. 3 illustrates a cross-sectional view of an exemplary organic light-emitting display panel consistent with disclosed embodiments. As shown in FIG. 3, the organic light-emitting display panel may include a substrate 100, an organic light-emitting device 200 disposed on one side of the substrate 100, and an encapsulation layer including a first organic encapsulation layer 3301.

The substrate 100 may be, for example, a glass substrate, a plastic substrate, a silicone substrate, or a metal substrate, which is not limited by the present disclosure. The organic light-emitting device 200 may be any appropriate organic light-emitting devices. In one embodiment, as shown in FIG. 3, the substrate may be a silicon substrate, and the organic light-emitting device 200 may be an organic light-emitting diode (OLED).

The organic light-emitting device 200 may have a first side facing the substrate 100 and an opposing side. The encapsulation layer including a first organic encapsulation layer 3301 may be disposed on the opposing side of the organic light-emitting device 200. The first organic encapsulation layer 3301 may have a polymer network formed by crosslinking the polyorganosiloxane. The material for forming the network polymer of the cross-linked polyorganosiloxane may be determined according to various application scenarios.

In one embodiment, the material (i.e., uncured encapsulation material) for forming the network polymer of the cross-linked polyorganosiloxane may include at least one of: component (i) polyorganosiloxane having a block structure of chemical formula (Q-1) and component (ii) polyorganosiloxane having a block structure of the following chemical formula (Q-2), where

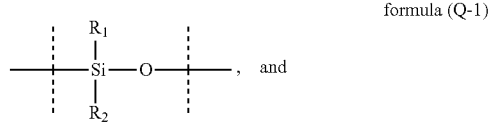

formula (Q-1), and

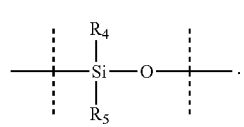

formula (Q-2)

In the chemical formula (Q-1), at least one of $R_1$ and $R_2$ may be a photo-curable functional group. When one of R1 and R2 is a photo-curable functional group, the other of $R_1$ and $R_2$ may include any one material selected from or a combination of at least two materials selected from hydrogen, a substituted or unsubstituted hydrocarbon, a substituted or unsubstituted aromatic base, and a substituted or unsubstituted polysiloxane. The polymerization degree n1 of the polyorganosiloxane of the component (i) may be 1 to 100, such as 2, 5, 9, 11, 14, 16, 18, 19, 22, 25, 29, 31, 34, 36, 38, 39, 42, 45, 49, 51, 54, 56, 53, 59, 62, 65, 69, 71, 74, 76, 78, 79, 82, 85, 89, 91, 94, 96, 98, 99.

In the chemical formula (Q-2), at least one of $R_4$ and or $R_5$ may be a mercaptoalkyl. When one of $R_4$ and or $R_5$ is a mercaptoalkyl, the other of $R_4$ and or $R_5$ may include any one material selected from or a combination of at least two materials selected from hydrogen, a substituted or unsubstituted hydrocarbon, a substituted or unsubstituted polysiloxane, and a photo-curable functional group. The polymerization degree n2 of the polyorganosiloxane of the component (ii) may be 1 to 100, such as 2, 5, 9, 11, 14, 16, 18, 19, 22, 25, 29, 31, 34, 36, 38, 39, 42, 45, 49, 51, 54, 56, 58, 59, 62, 65, 69, 71, 74, 76, 78, 79, 82, 85, 89, 91, 94, 96, 98, 99.

In the component (i) and component (ii), at least one of the photo-curable functional groups and the thiol groups may be crosslinked, such that linear polyorganosiloxane may be crosslinked to form a polymer network. The polymerization degree may be determined according to various application scenarios, such that the viscosity of the polyorganosiloxane may be configured in a desired range, which may be compatible with the existing inkjet printing process.

When the polymer network, includes a substantially large number of repeating units, the viscosity of the polyorganosiloxane may be substantially high, which may increase the difficulties of ejecting the ink droplets through the printing nozzle. On the other hand, when the polymer network includes a substantially small number of repeating units, the viscosity of the polyorganosiloxane may be substantially low, which may be incompatible with inkjet printing process.

In one embodiment, in the polyorganosiloxane of the component (i), the number of the siloxane repeating units having the substituted photo-curable functional group may account for more than 50% of the total number of the siloxane repeating units, such as 52 wt %, 54 wt %, 56 wt %, 59 wt %, 62 wt %, 64 wt %, 66 wt %, 68 wt %, 72 wt %, 74 wt %, 76 wt %, 79 wt % 84 wt %, 86 wt %, 8$ wt %, 92 wt %, 96 wt %, and 99 wt %.

In the polyorganosiloxane of the component (i), when the number of the siloxane repeating units having, the photo-curable functional groups accounts for approximately more than 50% of the total number of the siloxane repeating units, the moisture and oxygen barrier properties of the formed encapsulation material may be improved, and the flexibility and light transmission of the formed encapsulation material may also be improved.

In the polyorganosiloxane of the component (ii), the number of the substituted siloxane repeating units having the mercaptoalkyl may account for approximately 1%-50% of the total number of the siloxane repeating units, such as 52 wt %, 54 wt %, 56 wt %, 59 wt %, 62 wt %, 64 wt %, 66 wt %, 68 wt %, 72 wt %, 74 wt %, 76 wt %, 79 wt % 84 wt %, 86 wt %, 88 wt %, 92 wt %, 96 wt %, and 99 wt %.

In one embodiment, in the chemical formula (Q-1), when one of $R_1$ and $R_2$ is a photo-curable functional group, the other of $R_1$ and $R_2$ may include at least one selected from or a combination of at least two selected from hydrogen, a substituted or unsubstituted $C_1$-$C_6$ alkyl, a substituted or unsubstituted $C_6$ to $C_{12}$ aryl.

For example, the substituted or unsubstituted $C_1$-$C_6$ alkyl may include methyl, ethyl, n-propyl, n-butyl, isopropyl, isobutyl, n-pentyl, n-hexyl, hydroxymethyl, hydroxyethyl, carboxymethyl, carboxyethyl, carboxypentyl, aminopropyl, and aminopentyl, etc.

For example, the substituted or unsubstituted $C_6$ to $C_{12}$ aryl may include phenyl, biphenyl, monomethylphenyl, naphthyl, monomethylnaphthyl, propylphenyl, hydroxymethylphenyl, and hydroxyphenyl, etc.

In the chemical formula (Q-2), the mercaptoalkyl may be selected from substituted or unsubstituted $C_1$ to $C_{10}$ mercaptoalkyls. For example, the substituted or unsubstituted $C_1$ to $C_{10}$ mercaptoalkyl may include mercaptomethyl, mercaptoethyl, mercaptopropyl, mercaptobutyl, mercaptohexyl, and mercapto-pentyl.

The photo-curable functional group is a functional group capable of bonding under photo-catalysis. The photo-curable functional group may include a group having a double bond at the terminal, a group having an acetylenic bond at the terminal, a mercapto group, and a hydroxyl group, etc.

In one embodiment, the photo-curable functional group may have the structure represented by chemical formula (II-1) or chemical formula (II-2), where

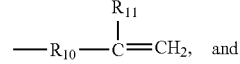

formula (II-1)

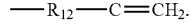

formula (II-1)

In the chemical formula (II-1) and (II-2), $R_{10}$ and $R_{12}$ may be selected from hydrogen and a substituted or unsubstituted alkylene, which the alkylene may have two hydrocarbons removed from the corresponding hydrocarbon, $R_{11}$ may be selected from a substituted or unsubstituted hydrocarbon.

In one embodiment, the photo-curable functional group may include any one material selected from or a combination of at least two materials selected from vinyl, allyl, alkenyl,

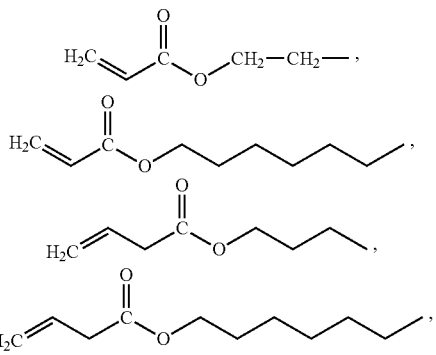

ethynyl, propargyl, acetylene, 2-methylallyl, 2-methylpentyl.

It should be noted that, the above-mentioned photo-curable functional groups are for illustrative purposes and are not intended to limit the scope of the present disclosure. Any appropriate compounds satisfying the chemical formulas (II-1) and (II-2) may be selected as the photo-curable functional group, such as vinylphenyl, vinylbenzyl, vinyltoluene,

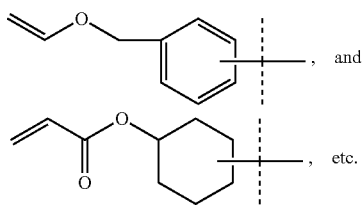

In another embodiment, the material for forming the network polymer of the cross-linked polyorganosiloxane may include polyorganosiloxane having a block structure of the chemical formula (Q-1), and a photo-initiator. The corresponding formed encapsulation layer may have substantially high light transmittance, as well as, good temperature resistance, flexibility, and moisture resistance.

In another embodiment, the material for forming the network polymer of the cross-linked polyorganosiloxane may include polyorganosiloxane having a block structure of the chemical formula (Q-2), and a photo-initiator. The corresponding formed encapsulation layer may have good shock resistance, flexibility and moisture resistance.

In another embodiment, the material for forming the network polymer of the cross-linked polyorganosiloxane may include polyorganosiloxane having a block structure of the chemical formula (Q-1), polyorganosiloxane having a block structure of the chemical formula (Q-2), and a photo-initiator. The corresponding formed encapsulation layer may have a three-dimensional network structure and, meanwhile, may have high light transmittance, as well as, good shock resistance, temperature resistance and moisture resistance.

That is, the polyorganosiloxane having the block structure of chemical formula (Q-1) and the polyorganosiloxane having a block structure of the chemical formula (Q-2) each may be mixed with the photo-initiator to form the encapsulation layer, or the polyorganosiloxane having the block structure of chemical formula (Q-1), the polyorganosiloxane having the block structure of the chemical formula (Q-2), and the photo-initiator three together may be mixed to form the encapsulation layer.

In particular, when the polyorganosiloxane having the block structure of chemical formula (Q-1), the polyorganosiloxane having the block structure of the chemical formula (Q-2), and the photo-initiator are mixed to form the encapsulation layer, the polyorganosiloxane having the block structure of the chemical formula (Q-1) may improve the light transmittance and temperature resistance of the formed encapsulation layer, while the polyorganosiloxane having the block structure of the chemical formula (Q-2) may improve the shock resistance of the formed encapsulation layer.

In another embodiment, the material for forming the network polymer of the cross-linked polyorganosiloxane may comprise the following:

component (i): polyorganosiloxane having a block structure of the chemical formula (Q-1), with 0 to 99 weight percentage;

component (ii): polyorganosiloxane having a block structure of the chemical formula (Q-2), with 0 to 99 weight percentage; and component (iii): a photo-initiator, with 0.01 to 30 weight percentage.

In particular, at least one of the component (i) and the component (ii) may have a weight percentage large than zero, and the sum of the weight percentage of the component (i), the component (ii) and the component (iii) may be equal to approximately 100.

The polyorganosiloxane with a predetermined block structure and a predetermined weight percentage may form a crosslinked polymer network after being photo-cured, thereby achieving an encapsulation layer with high light transmittance, good flexibility and moisture resistance.

For example, the photo-initiator may include any one material selected from or a combination of at least two materials selected from a triazine initiator, an acetophenone initiator, a benzophenone initiator, a benzoin initiator, a phosphorus initiator, and an oxime initiator. The photo-initiator is not limited by the present disclosure, and any appropriate photo-initiator may be adopted to form the encapsulation layer.

For example, the triazine initiator may include any one material selected from or a combination of at least two materials selected from 2,4,6-trichloro-s-triazine, 2-phenyl-4,6-bis (trichloromethyl)-s-triazine, 2-(3',4'-dimethoxystyryl)-4,6-bis (trichloromethyl)-s-triazine, 2-(4'-methoxynaphthyl)-4,6-bis (trichloromethyl)-s-triazine, 2-(p-methoxyphenyl)-4,6-bis (trichloromethyl)-s-triazine, 2-(p-tolyl) 4-bis (trichloromethyl)-s-triazine, bis (trichloromethyl)-6-tri-triazine, 2-(naphthalen-1-yl)-4,6-bis (trichloromethyl)-s-triazine, 2-(4-methoxynaphthalen-)-4,6-bis (trichloromethyl)-s-triazine, 2,4-bis(trichloromethyl)-6-(piperonyl)-s-triazine and 2,4-bis chloromethyl)-6-(4'-methoxystyryl)-s-triazine.

For example, the acetophenone initiator may include any one material selected from or a combination of at least two materials selected from 2,2'-diethoxyacetophenone, 2,2'-dibutoxyacetophenone, 2-hydroxy-2-methylpropiophenone, p-tert-butyl trichloroacetophenone, p-tert-butyl dichloroacetophenone, 4-chloroacetophenone, 2,2'-dichloro-4-phenoxyacetophenone, 2-methyl (4-methylphenyl) phenyl)-2-morpholinopropan-1-ketone, and 2-benzyl-2-dimethylamiobutane-1-ketone.

For example, the benzophenone initiator may include any one material selected from or a combination of at least two materials selected from benzophenone, benzoyl benzoic acid, methyl benzophenone benzoyl benzoate, 4-phenylbenzophenone, hydroxy benzophenone, acrylicated benzophenone, 4,4'-bis (dimethylamino) benzophenone, 4,4'-dichlorobenzophenone, and 3,3'-dimethyl-2-methoxybis.

For example, the thioxanthone initiator may include any one material selected from or a combination of at least two materials selected from thioxanthone, 2-methylthioxanthone, isopropyl thioxanthone, 2,4-diethylthioxanthone, 2,4-diisopropylthioxanthone, and 2-chlorothioxanthone.

For example, the benzoin initiator may include any one material selected from or a combination of at least two materials selected from benzoin, benzoin methyl ether, benzoin ethyl ether, benzoin isopropyl ether, benzoin isobutyl ether, and benzyl dimethyl ketal.

For example, the phosphorus initiator may include any one material selected from or a combination of at least two materials selected from dibenzoylphenylphosphine oxide and benzoyl biphenylphosphine oxide. For example, the oxime initiators may include any one material selected from or a combination of at least two materials selected from 2-(o-benzoyl oxime)-1-[4-(phenylthio)phenyl]-1,2-octane-dione, 1-(o-acetyl oxime)-1-[9-ethyl-6-(2-methylbenzoyl)-9H-carbazol-3-yl] Ethyl ketone.

In one embodiment, the material for forming the network polymer of the cross-linked polyorganosiloxane may have a viscosity of approximately 8 to 100 cps at 25 to 50° C. such as 10 cps, 13 cps, 14 cps, 16 cps, 17 cps, 18 cps, 19 cps, 20 cps, 22 cps, 45 cps, 50 cps, 52 cps, 54 cps, 55 cps, 30 cps, 30 cps, 32 cps, 34 cps, 35 cps, 37 cps, 39 cps, 39 cps, 20 cps, 42 cps, 44 cps, 45 cps, 47 cps, 49 cps, 50 cps, 64 cps, 65 cps, 85 cps, 87 cps, 89 cps, 90 cps, 92 cps, 94 cps, 96 cps, 97 cps, or 99 cps.

A desired polymerization degree of the polyorganosiloxane may enable the polyorganosiloxane to have a desired viscosity, for example, approximately 8 to 100 cps at 25 to 50° C., which may facility the formation of the encapsulation layer by the inkjet printing process.

The thickness of the organic layer may be determined according to various application scenarios. In one embodiment, the thickness of the organic layer may be approximately 1 to 20 μm, such as 2 μm, 5 μm, 6 μm, 8 μm, 10 μm, 12 μm, 13 μm, 16 μm, 18 μm, or 19 μm.

Figure 9:
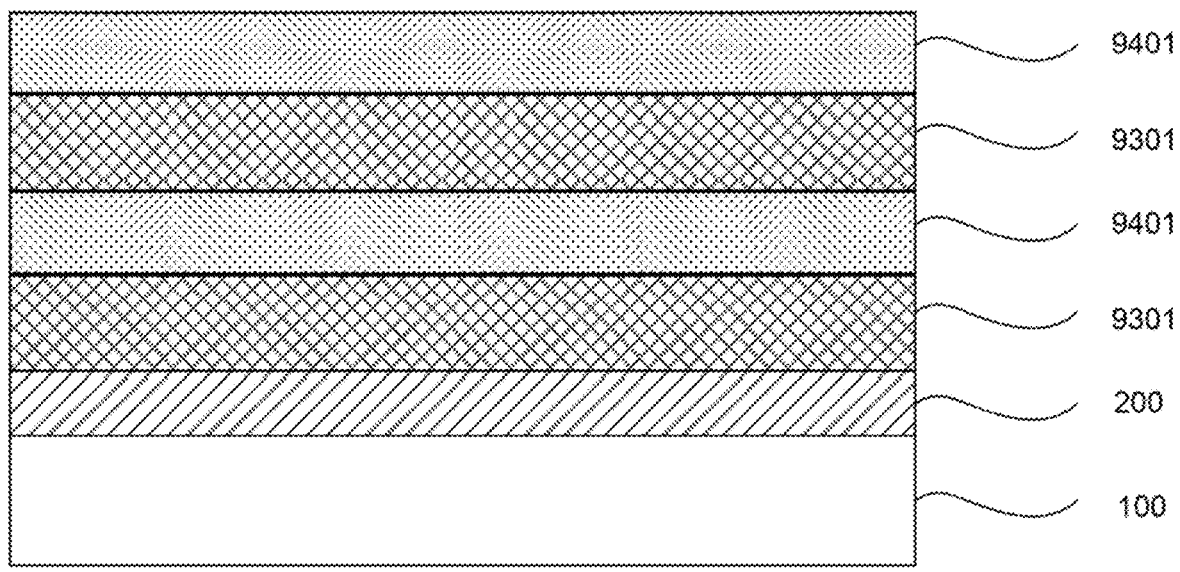
FIG. 9 illustrates a cross-sectional view of another exemplary organic light-emitting display panel consistent with disclosed embodiments.

FIG. 9 illustrates a cross-sectional view of another exemplary organic light-emitting display panel consistent with disclosed embodiments. The similarities between FIG. 3 and FIG. 9 are not repeated here, while certain difference may be explained.

As shown in FIG. 9, the encapsulation layer may comprise at least one organic encapsulation layer 9301 and at least one inorganic encapsulation layer 9401 alternately disposed in a direction perpendicular to the substrate 100. The layer which is disposed closest to the organic light-emitting device 200 may be the organic encapsulation layer 9301. At least one organic encapsulation layer 9301 may have a polymer network formed by crosslinking the polyorganosiloxane.

When the organic encapsulation layer 9301 and the inorganic encapsulation layer 9401 are alternately arranged, the smoothness of the inorganic encapsulation layer 9401 may be ensured and, meanwhile, the organic encapsulation layer 9301 may prevent the defects in the inorganic encapsulation layer 9401 from extending to other regions of the inorganic encapsulation layer 9401.

The number of the organic encapsulation layers 9301 and the number of the inorganic encapsulation layers 9401 shown in FIG. 9 are for illustrative purposes and are not intended to limit the scope of the present disclosure. The number of the organic encapsulation layer 9301s and the inorganic encapsulation layers 9401, as well as, the stack configuration of the organic encapsulation layers 9301 and the inorganic encapsulation layer 9401s in the encapsulation layer, may be determined according to various application.

For example, the number of the organic encapsulation layers 9301 and the inorganic encapsulation layers 9401, as well as, the stack configuration of the organic encapsulation layers 9301 and the inorganic encapsulation layers 9401 in the encapsulation layer, may be determined according to a degree of tolerance of the display panel to at least one of oxygen, moisture, water vapor, and chemical material penetration.

In another embodiment, the encapsulation layer may comprise one organic encapsulation layer and one inorganic encapsulation layer alternately disposed in a direction perpendicular to the encapsulation layer. The layer which is disposed closest to the organic light-entitling device may be the organic encapsulation layer. The organic encapsulation layer may have a polymer network formed by crosslinking the polyorganosiloxane. The corresponding structure is shown in FIG. 4.

Figure 4:
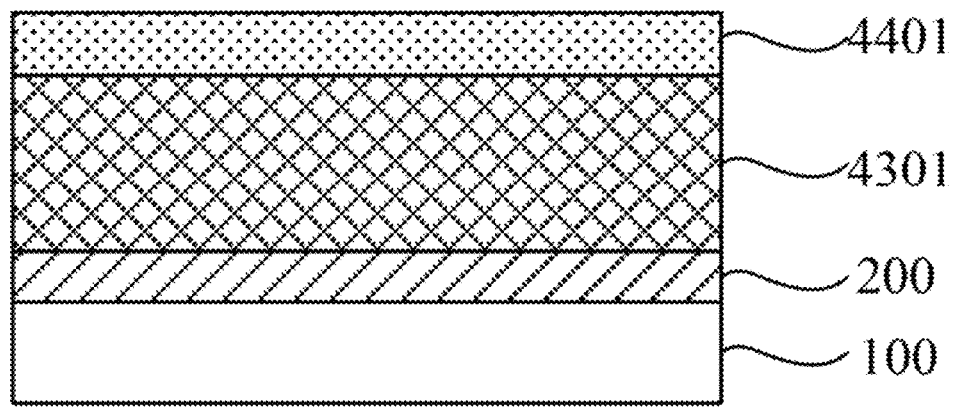
FIG. 4 illustrates a cross-sectional view of another exemplary organic light-emitting display panel consistent with disclosed embodiments.

FIG. 4 illustrates a cross-sectional view of another exemplary organic light-emitting display panel consistent with disclosed embodiments. The similarities between FIG. 3 and FIG. 4 are not illustrated here, while certain difference may be explained.

As shown in FIG. 4, the organic light-emitting display panel may include a substrate 100, an organic light-emitting device 200 disposed on one side of the substrate 100, and an encapsulation layer covering the organic light-emitting device 200. The organic light-emitting device 200 may have a first side facing the substrate 100 and an opposing side. The encapsulation layer may include a first organic encapsulation layer 4301, and a first inorganic encapsulation layer 4401, which may be sequentially disposed on the opposing side of the organic light-emitting device 200. That is, the layer which is disposed closest to the organic light-emitting device 200 may be the first, organic encapsulation layer 4301.

In particular, the first organic encapsulation layer 4301 may have a polymer network formed by crosslinking the polyorganosiloxane, and the polymer network formed by crosslinking the polyorganosiloxane in the first organic encapsulation layer 4301 in FIG. 4 may be similar to the polymer network formed by crosslinking the polyorganosiloxane in the first organic encapsulation layer 3301 in FIG. 3.

In another embodiment, the encapsulation layer may comprise at least one organic encapsulation layer and at least one inorganic encapsulation layer, and the layer which is disposed closest to the organic light-emitting device may be an inorganic encapsulation layer. At least one organic encapsulation layer may have a polymer network formed by crosslinking the polyorganosiloxane. The corresponding structure is shown in FIG. 10.

Figure 10:
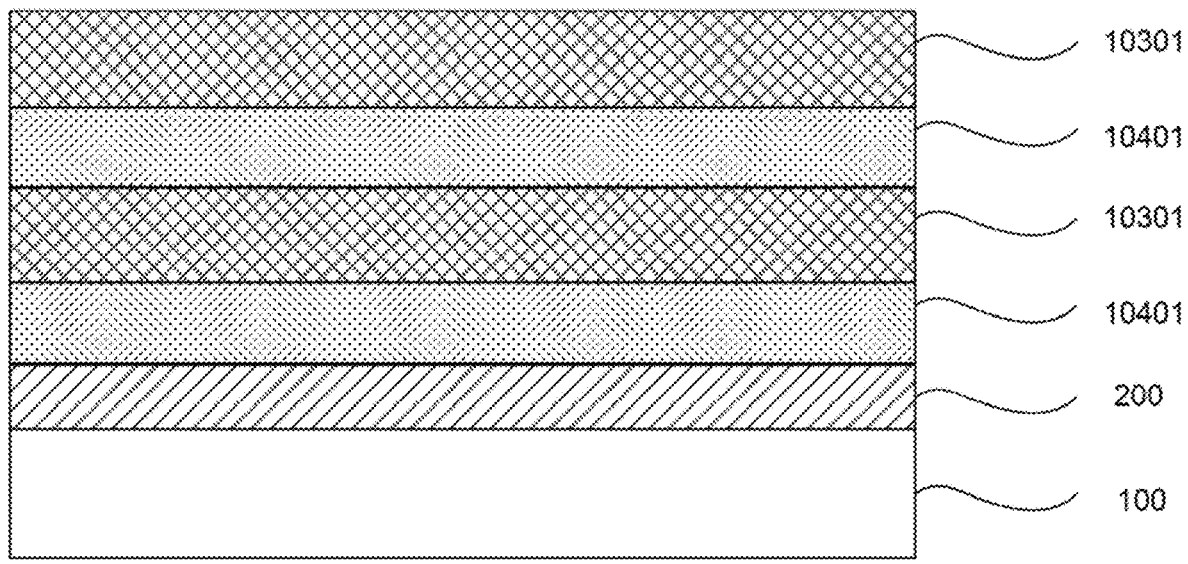
FIG. 10 illustrates a cross-sectional view of another exemplary organic light-emitting display panel consistent with disclosed embodiments.

FIG. 10 illustrates a cross-sectional view of another exemplary organic light-emitting display panel consistent with disclosed embodiments. The similarities between FIG. 3 and FIG. 10 are not repeated here, while certain difference may be explained.

As shown in FIG. 10, the encapsulation layer may comprise at least one organic encapsulation layer 10301 and at least one inorganic encapsulation layer 10401 alternately disposed in a direction perpendicular to the substrate 100. The layer which is disposed closest to the organic light-emitting device 200 may be the inorganic encapsulation layer 10401. At least one organic encapsulation layer 10301 may have a polymer network formed by crosslinking the polyorganosiloxane.

In another embodiment, the encapsulation layer may comprise one organic encapsulation layer and one inorganic encapsulation layer alternately disposed in a direction perpendicular to the encapsulation layer. The layer which is disposed closest to the organic light-emitting device may be the inorganic encapsulation layer. The organic encapsulation layer may have a polymer network formed by crosslinking the polyorganosiloxane. The corresponding structure is shown in FIG. 6.

Figure 6:
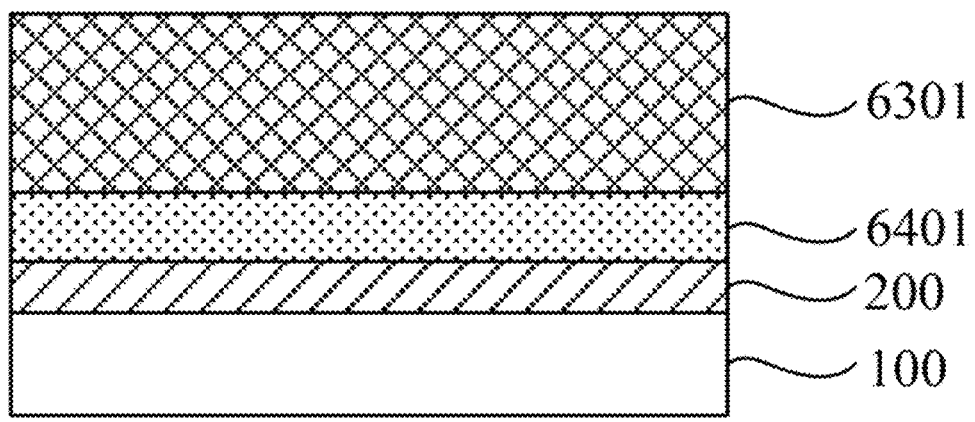
FIG. 6 illustrates a cross-sectional view of another exemplary organic light-emitting display panel consistent with disclosed embodiments.

FIG. 6 illustrates a cross-sectional view of another exemplary organic light-emitting display panel consistent with disclosed embodiments. The similarities between FIG. 3 and FIG. 6 are not illustrated here, while certain difference may be explained.

As shown in FIG. 6, the organic light-emitting device 200 may have a first side facing the substrate 100 and an opposing side. The encapsulation layer may include a first inorganic encapsulation layer 6401 and a first organic encapsulation layer 6301, which may be sequentially disposed on the opposing side of the organic light-emitting device 200. That is, the layer which is disposed closest to the organic light-emitting device 200 may be the first inorganic encapsulation layer 6401.

In particular, the first organic encapsulation layer 6301 may have a polymer network formed by crosslinking the polyorganosiloxane, and the polymer network formed by crosslinking the polyorganosiloxane in the first organic encapsulation layer 6301 in FIG. 6 may be similar to the polymer network formed by crosslinking the polyorganosiloxane in the first organic encapsulation layer 3301 in FIG. 3.

In another embodiment, the encapsulation layer may comprise a first organic encapsulation layer, a first inorganic encapsulation layer, and a second organic encapsulation layer, which are sequentially disposed on the side of the organic light-emitting display panel. In particular, at least one of the first organic encapsulation layer and the second organic encapsulation layer may have a polymer network formed by crosslinking the polyorganosiloxane. The corresponding structure is shown in FIG. 11.

Figure 11:
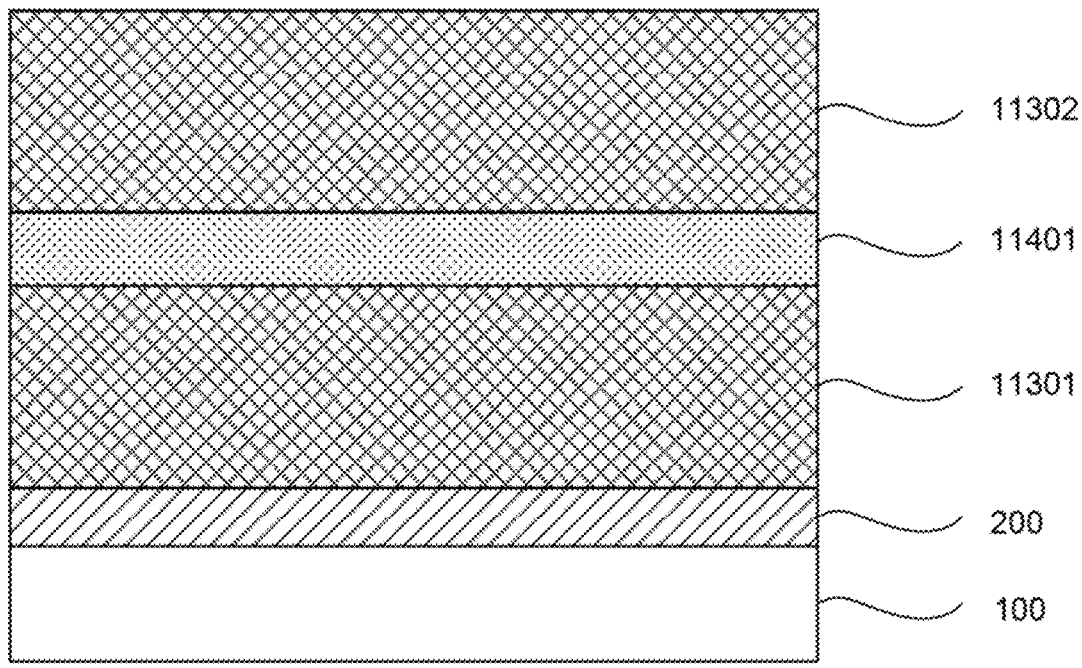
FIG. 11 illustrates a cross-sectional view of another exemplary organic light-emitting display panel consistent with disclosed embodiments.

FIG. 11 illustrates a cross-sectional view of another exemplary organic light-emitting display panel consistent with disclosed embodiments. The similarities between FIG. 3 and FIG. 11 are not illustrated here, while certain difference may be explained.

As shown in FIG. 11, the organic light-emitting device 200 may have a first side facing the substrate 100 and an opposing side. The encapsulation layer may include a first organic encapsulation layer 11301, a first inorganic encapsulation layer 11401, and a second organic encapsulation layer 11302, which may be sequentially disposed cm the opposing side of the organic light-emitting device 2130. At least one of the first organic encapsulation layer 11301 and the second organic encapsulation layer 11302 may have a polymer network formed by crosslinking the polyorganosiloxane.

In another embodiment, the encapsulation layer may comprise a first inorganic encapsulation layer, a first organic encapsulation layer, and a second inorganic encapsulation layer, which are sequentially disposed on the side of the organic light-emitting display panel. In particular, the first organic encapsulation layer may have a polymer network formed by crosslinking the polyorganosiloxane. The corresponding structure is shown in FIG. 5.

Figure 5:
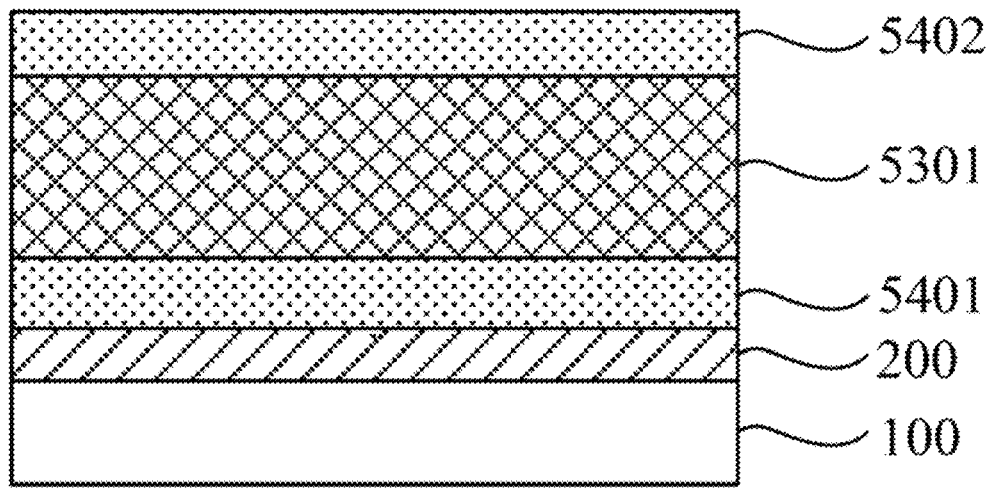
FIG. 5 illustrates a cross-sectional view of another exemplary organic light-emitting display panel consistent with disclosed embodiments.

FIG. 5 illustrates a cross-sectional view of another exemplary organic light-emitting display panel consistent with disclosed embodiments. The similarities between FIG. 3 and FIG. 5 are not illustrated here, while certain difference may be explained.

As shown in FIG. 5, the organic light-emitting device 200 may have a first side facing the substrate 100 and an opposing side. The encapsulation layer may include a first inorganic encapsulation layer 5401, a first organic encapsulation layer 5301, and a second inorganic encapsulation layer 5402, which may be sequentially disposed on the opposing side of the organic light-emitting device 200. The first organic encapsulation layer 5301 may have a polymer network formed by crosslinking the polyorganosiloxane.

Figure 7:
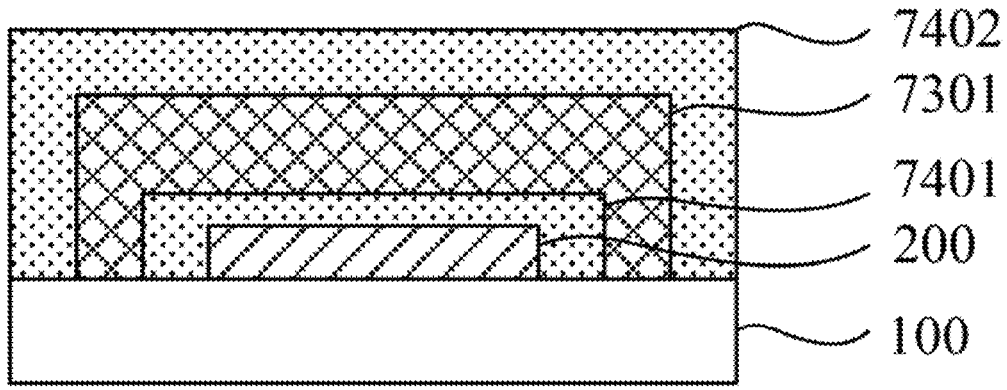
FIG. 7 illustrates a cross-sectional view of another exemplary organic light-emitting display panel consistent with disclosed embodiments.

FIG. 7 illustrates a cross-sectional view of another exemplary organic light-emitting display panel consistent with disclosed embodiments. The similarities between FIG. 3 and FIG. 7 are not illustrated here, while certain difference may be explained.

As shown in FIG. 7, the organic light-emitting display panel may include a substrate 100, an organic light-emitting device 200 disposed on one side of the substrate 100, and an encapsulation layer covering the organic light-emitting device 200. In particular, the encapsulation layer may cover the surface and the periphery of the organic light-emitting device 200. That is, the encapsulation layer may be disposed covering and surrounding the organic light-emitting device 200.

The organic light-emitting device 200 may have a first side facing the substrate 100 and an opposing, side. The encapsulation layer may include a first inorganic encapsulation layer 7401, a first organic encapsulation layer 7301, and a second inorganic encapsulation layer 7402, which may be sequentially disposed on the opposing side of the organic light-emitting device 200. In particular, the first inorganic encapsulation layer 7401 may cover the surface and the periphery of the organic light-emitting device 200, the first organic encapsulation layer 7301 may cover the surface and the periphery of the first inorganic encapsulation layer 7401, and the second inorganic encapsulation layer 7402 may cover the surface and the periphery of the first organic encapsulation layer 7301.

That is, the first inorganic encapsulation layer 7401 may be disposed covering and surrounding the organic light-emitting device 200, the first organic encapsulation layer 7301 may be disposed covering and surrounding the first inorganic encapsulation layer 7401, and the second inorganic encapsulation layer 7402 may be disposed covering and surrounding the first organic encapsulation layer 7301.

Figure 8:
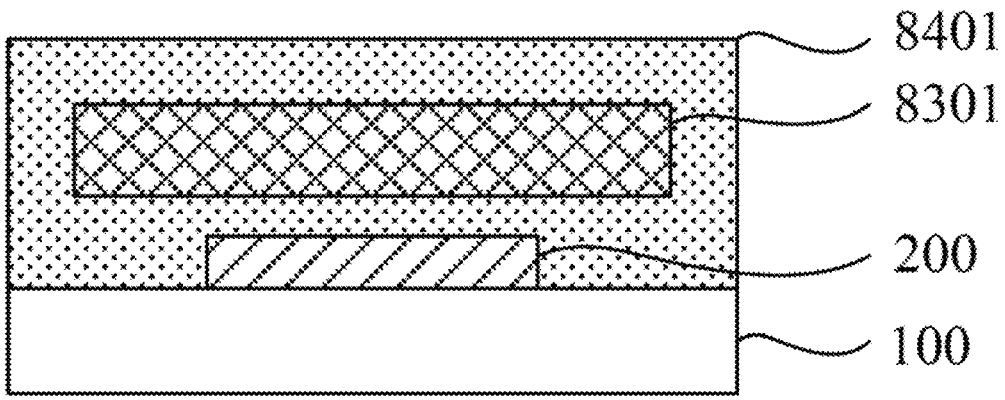
FIG. 8 illustrates a cross-sectional view of another exemplary organic light-emitting display panel consistent with disclosed embodiments.

FIG. 8 illustrates a cross-sectional view of another exemplary organic light-emitting display panel consistent with disclosed embodiments. The similarities between FIG. 7 and FIG. 8 are not illustrated here, while certain difference may be explained.

As shown in FIG. 8, the organic light-emitting display panel may include a substrate 100, an organic light-emitting device 200 disposed on one side of the substrate 100, and an encapsulation layer covering the organic light-emitting device 200. In particular, the encapsulation layer may cover the surface and the periphery of the organic light-emitting device 200. That is, the encapsulation layer may be disposed covering and surrounding the organic light-emitting device 200.

The encapsulation layer may include a first inorganic encapsulation layer 8401, and a first organic encapsulation layer 8301, and a second inorganic encapsulation layer 8402. In particular, the first inorganic encapsulation layer 8401 may cover the surface and the periphery of the organic light-emitting device 200 and, meanwhile, cover the surface and the periphery of the first organic encapsulation layer 8301.

The organic light-emitting device 200 may have a first side facing the substrate 100 and an opposing side. In one embodiment, the first organic encapsulation layer 8301 may be disposed on the opposing side of the organic light-emitting device 200. In another embodiment, a gap may be formed between the first organic encapsulation layer 8301 and the organic light-emitting device 200.

In the disclosed embodiments, the thickness of inorganic encapsulation layer may be determined according to various application scenarios. In one embodiment, the thickness of the inorganic encapsulation layer may be smaller than 1 µm, such as 0.8 µm, 0.7 µm, 0.6 µm, 0.5 µm, 0.4 µm, 0.3 µm, 0.2 µm, 0.1 µm, 0.08 µm, 0.06 µm, 0.05 µm, 0.03 µm, or 0.01 µm.

The inorganic encapsulation layer may enhance the barrier properties of the organic encapsulation layer. Any appropriate inorganic encapsulation layer may be adopted, as long as the inorganic encapsulation layer exhibits desired light transmittance, and good moisture and oxygen barrier properties.

For example, the inorganic encapsulation layer may include any one material selected from or a combination of at least two materials selected from a metal, a metal alloy, an intermetallic compound, a metal oxide, an alloy oxide, a metal fluoride, an alloy fluoride, a metal nitride, an alley nitride, a metal carbide, an alloy carbide, a metal boride, an alloy boride, a metal silicide, and an alloy silicide.

In one embodiment, the material of the inorganic encapsulating layer may include any one selected from or a combination of a metal oxide, a metal nitride, a metal carbide, and a metal oxynitride.

The metal in the inorganic encapsulating layer may include any one of or a combination of an alkali metal and an alkaline earth metal, such as silicon (Si), aluminum (Al), selenium (Se), zinc (Zn), antimony (Sb), indium (In), germanium (Ge), tin (Sn), bismuth (Bi), transition metal, and lanthanide.

In one embodiment, the inorganic encapsulating layer may include silicon oxide, silicon nitride, silicon oxynitride, ZnSe, ZnO, $Sb_2O_3$, $Al_2O_3$, $In_2O_3$ or $Sn_2O_3$.

The inorganic encapsulating layer may be fabricated through sputtering, chemical vapor deposition, metal organic chemical vapor deposition, plasma chemical vapor deposition, atomic vapor deposition, or electron cyclotron resonance.

In one embodiment, the material of the inorganic encapsulating layer may include silicon nitride or aluminum oxide. In one embodiment, the organic encapsulation layer may be formed by an inkjet printing process.

Figure 12:
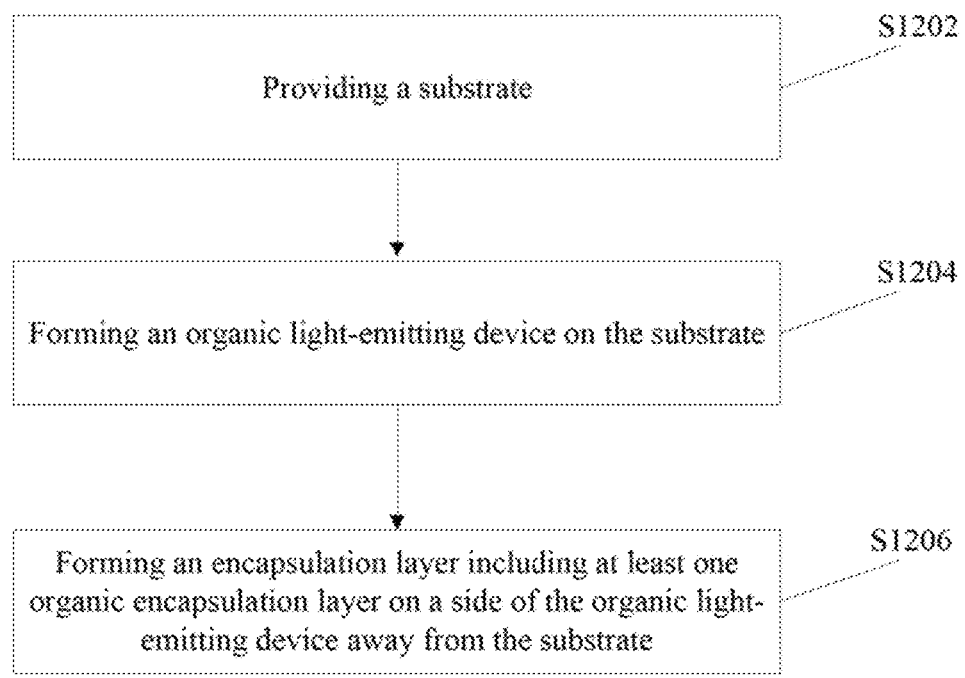
FIG. 12 illustrates a flow chart of an exemplary organic light-emitting display panel fabricating method consistent with disclosed embodiments.

The present disclosure also provides a fabricating method for the disclosed organic light-emitting display panel. FIG. 12 illustrates a flow chart of an exemplary organic light-emitting display panel fabricating method consistent with disclosed embodiments.

As shown in FIG. 12, at the beginning, a substrate is provided (S1202). The corresponding structure is shown in FIG. 3. As shown in FIG. 3, the substrate 100 may be provided, which may be, for example, a glass substrate, a plastic substrate, a silicone substrate, or a metal substrate.

Returning to FIG. 12, after the substrate is provided, an organic light-emitting device is formed on the substrate (S1204). The corresponding structure is shown in FIG. 3. As shown in FIG. 3, the organic light-emitting device 200 may be disposed on one side of the substrate 100. The organic light-emitting device 200 may be air organic light-emitting diode (OLED), or any appropriate organic light-emitting devices.

Returning to FIG. 12, after the organic fight-emitting device is formed on the substrate, an encapsulation layer is formed on one side of the organic light-emitting device away from the substrate (S1206). The corresponding structure is shown in FIG. 3. As shown in FIG. 3, the encapsulation layer may be formed on one side of the organic light-emitting device 200 away from the substrate.

In one embodiment, the encapsulation layer may include at least one organic encapsulation layer, which may have a polymer network formed by crosslinking the polyorganosiloxane. In another embodiment, the encapsulation layer may comprise at least one organic encapsulation layer and at least one inorganic encapsulation layer alternately disposed in a direction perpendicular to the substrate 100, and the at least one organic encapsulation layer, which may have a polymer network formed by crosslinking the polyorganosiloxane.

Figure 13:
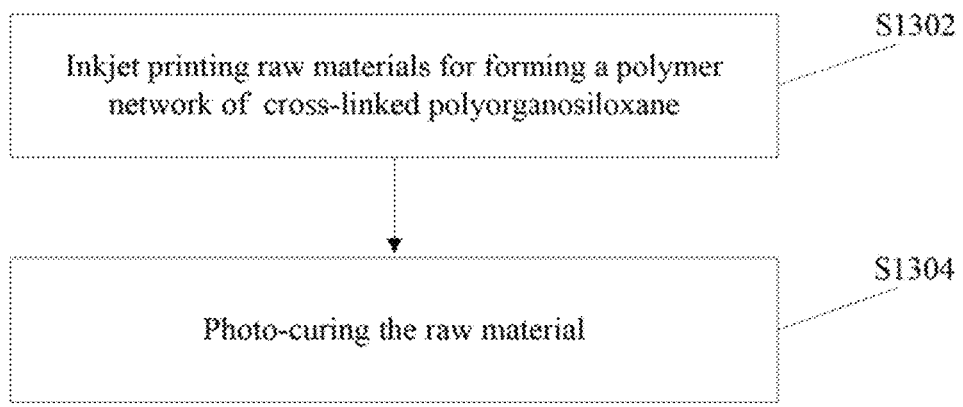
FIG. 13 illustrates a flow chart of forming an encapsulation layer on an organic light-emitting device in art exemplary organic light-emitting display panel fabricating method consistent with disclosed embodiments.

FIG. 13 illustrates a flow chart of forming an encapsulation layer on an organic light-emitting device in an exemplary organic light-emitting display panel fabricating method consistent with disclosed embodiments.

As shown in FIG. 13, at the beginning, material for forming a network polymer by the cross-linked polyorganosiloxane are inkjet printed on the substrate (S1302). In one embodiment, the material for forming the network polymer of the cross-linked polyorganosiloxane may include at least one of: component (i) polyorganosiloxane having a block structure of chemical formula (Q-1) and component (ii) polyorganosiloxane having a block structure of chemical formula (Q-2).

The polyorganosiloxane having the block structure of the chemical formula (Q-1) may be fabricated by an existing polyorganosiloxane polymerization method or commercially available. The polyorganosiloxane having the block structure of the chemical formula (Q-2) may be fabricated by an existing polyorganosiloxane polymerization method or commercially available.

In one embodiment, the inkjet printing temperature may be, configured to be approximately 20 to 30° C., such as 21° C., 22° C., 23° C., 24° C., 25° C., 26° C., 27° C., 28° C., or 29° C.

After the material for forming a network polymer by the cross-linked polyorganosiloxane are inkjet printed on the substrate, the material on the substrate are photo-cured (S1304).

In one embodiment, the wavelength for photo-curing may be longer than approximately 395 nm, and the energy for photo-curing ma be below approximately 1500 $mJ/cm^2$.

Example 1

Fabrication of Organic Light-Emitting Display Panels

Further, to evaluate the performance of the disclosed organic light-emitting display panels, seven exemplary organic light-emitting display panels according to the present disclosure and three reference organic light-emitting display panels are provided. The seven exemplary organic light-emitting display panels are named as the first to seventh disclosed display panels, respectively. The three reference organic light-emitting display panels are named as the first to third reference display panels, respectively.

In particular, the first to seventh disclosed display panels and the first to third reference display panels may have the same display panel structure shown in FIG. 3 and the same fabrication process. The fabricating method may comprise the following steps:

cleaning the silicon substrate;

forming the organic light-emitting device on the silicon substrate;

mixing material for forming the network polymer by the cross-linked polyorganosiloxane to obtain an inkjet printing stock solution having a viscosity of approximately 30 cps (at 25° C.), and spraying the material the opposing side of the organic light-emitting device by an inkjet printing method at 20 to 55° C., wherein the organic light-emitting device has the first side facing the substrate and the opposing side;

photo-curing the material under a wavelength of approximately 400 nm and an energy of approximately 1500 mJ/cm² to obtain an organic layer of 15 μm.

In the first disclosed display panel, referring to FIG. 3, the substrate 100 may be a silicon substrate. The organic light-emitting device may be an organic light-emitting diode (OLED), or any, appropriate organic light-emitting devices. The encapsulation layer may include a first organic encapsulation layer 3301, which may have a polymer network formed by crosslinking the polyorganosiloxane.

The material for forming a network polymer by the cross-linked polyorganosiloxane may include:

component (i): polyorganosiloxane having a block structure of

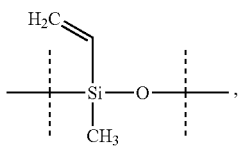

with a polymerization degree of approximately 20 and a weight percentage of approximately 80%, and the number of the siloxane units in

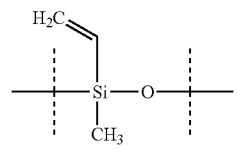

may account for approximately 80% of the total number of the siloxane repeating units;

component (ii): polyorganosiloxane having a block structure of

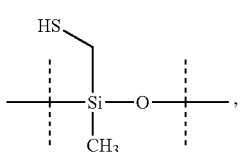

with a polymerization degree of approximately 20 and a weight percentage of approximately 15%, and the number of the siloxane units in

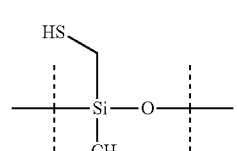

may account for approximately 80% of the total number of the siloxane repeating units; and component (iii) 2,4,6-trichloro-s-triazine, a weight percentage of approximately 5%.

In the second disclosed display panel, the material for forming a network polymer by the cross-linked polyorganosiloxane may include:

component (i): polyorganosiloxane having a block structure of

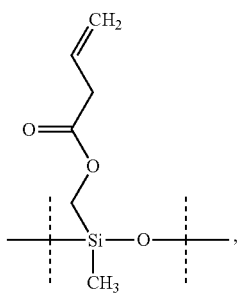

with a polymerization degree of approximately 20 and a weight percentage of approximately 80%, and the number of the siloxane units in

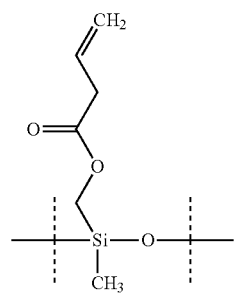

may account for approximately 80% of the total number of the siloxane repeating units;

component (ii): polyorganosiloxane having a block structure of

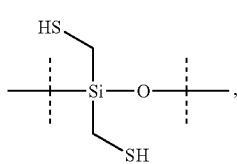

with a polymerization degree of approximately 20 and a weight percentage of approximately 15%, and the number of the siloxane units in

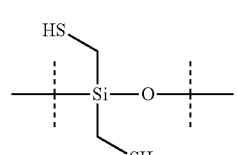

may account for approximately 80% of the total number of the siloxane repeating units; and component (iii) 2,4,6-trichloro-s-triazine, a weight percentage of approximately 5%.

In the third disclosed display panel, the material for forming a network polymer by the cross-linked polyorganosiloxane may include:

component (i): polyorganosiloxane having a block structure of

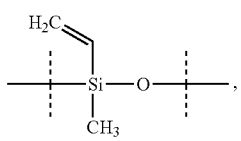

with a polymerization degree of approximately 20 and a weight percentage of approximately 95%, and the number of the siloxane units in

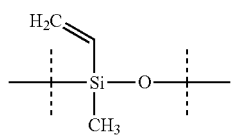

may account for approximately 80% of the total number of the siloxane repeating units; and component (iii) 2,4,6-trichloro-s-triazine, a weight percentage of approximately 5%.

In the fourth disclosed display panel, the material for forming a network polymer by the cross-linked polyorganosiloxane may include:

component (ii): polyorganosiloxane having a block structure of

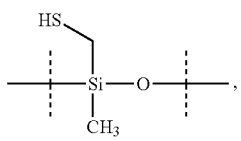

with a polymerization degree of approximately 20 and a weight percentage of approximately 95%, and the number of the siloxane units in

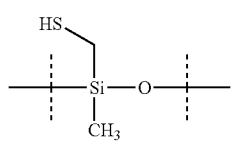

may account for approximately 80% of the total number of the siloxane repeating units; and component (iii) 2,4,6-trichloro-s-triazine, a weight percentage of approximately 5%.

In the fifth disclosed display panel, the material for forming a network polymer by the cross-linked polyorganosiloxane may include:

component (i): polyorganosiloxane having a block structure of

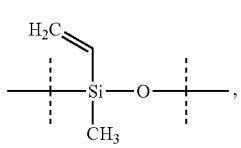

with a polymerization degree of approximately 100 and a weight percentage of approximately 50%, and the number of the siloxane units in

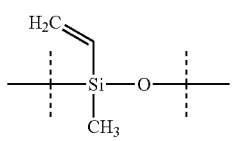

may account for approximately 80% of the total number of the siloxane repeating units;

component (ii): polyorganosiloxane having a block structure of

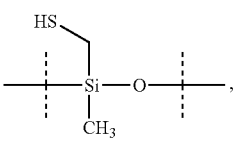

with a polymerization degree of approximately 1 and a weight percentage of approximately 45%, and the number of the siloxane units in

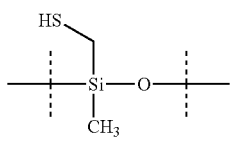

may account for approximately 80% of the total number of the siloxane repeating units; and component (iii) 2,4,6-trichloro-s-triazine, a weight percentage of approximately 5%.

In the sixth disclosed display panel, the material for forming a network polymer by the cross-linked polyorganosiloxane may include:

component (i): polyorganosiloxane having a block structure of

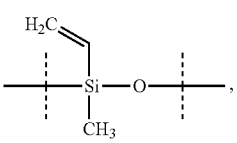

with a polymerization degree of approximately 20 and a weight percentage of approximately 50%, and the number of the siloxane units in

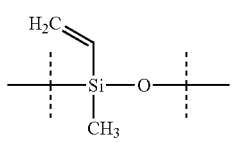

may account for approximately 50% of the total number of the siloxane repeating units;

component (ii): polyorganosiloxane having a block structure of

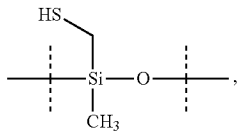

with a polymerization degree of approximately 20 and a weight percentage of approximately 45%, and the number of the siloxane units in

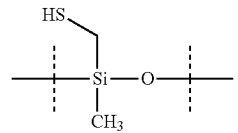

may account for approximately 90% of the total number of the siloxane repeating units; and component (iii) 2,4,6-trichloro-s-triazine, a weight percentage of approximately 5%.

In the seventh disclosed display panel, the material for forming a network polymer by the cross-linked polyorganosiloxane may include:

component (i): polyorganosiloxane having a block structure of

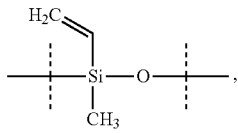

with a polymerization degree of approximately 20 and a weight percentage of approximately 50%, and the number of the siloxane units in

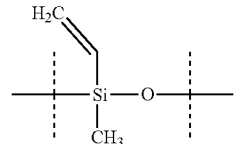

may account for approximately 70% of the total number of the siloxane repeating units;

component (ii): polyorganosiloxane having a block structure of

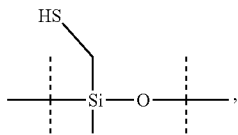

with a polymerization degree of approximately 20 and a weight percentage of approximately 45%, and the number of the siloxane units in

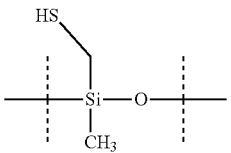

may account for approximately 50% of the total number of the siloxane repeating units; and component (iii) 2,4,6-trichloro-s-triazine, a weight percentage of approximately 5%.

The similarities between the first disclosed display panel and the first reference display panel are not illustrated here, while certain difference may be explained. Different from the first disclosed display panel, in the first reference display panel, the material for forming a network polymer by the cross-linked polyorganosiloxane may include:

component (i): polyorganosiloxane having a block structure of

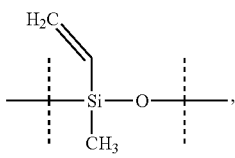

with a polymerization degree of approximately 110 and a weight percentage of approximately 50%, and the number of the siloxane units in

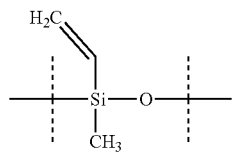

may account for approximately 80% of the total number of the siloxane repeating units;

component (ii): polyorganosiloxane having a block structure of

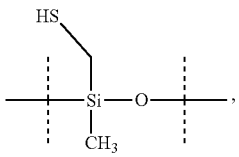

with a polymerization degree of approximately 20 and a weight percentage of approximately 45%, and the number of the siloxane units in

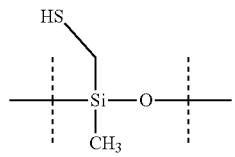

may account for approximately 80% of the total number of the siloxane repeating units; and component (iii) 2,4,6-trichloro-s-triazine, a weight percentage of approximately 5%.

The similarities between the second reference display panel and the first disclosed display panel are not illustrated here, while certain difference may be explained.

Different from the first disclosed display panel, in the second reference display panel, the encapsulation layer is formed by acrylic.

The similarities between the third reference display panel and the first disclosed display panel are not illustrated here, while certain difference may be explained.

Different from the first disclosed display panel, in the third reference display panel, the material for forming a network polymer by the cross-linked polyorganosiloxane may include:

component (i): polyorganosiloxane having a block structure of

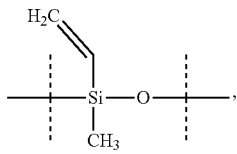

with a polymerization degree of approximately 110 and a weight percentage of approximately 50%, and the number of the siloxane units in

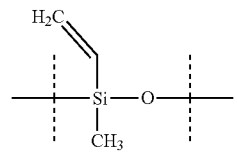

may account for approximately 40% of the total number of the siloxane repeating units;

component (ii): polyorganosiloxane having a block structure of

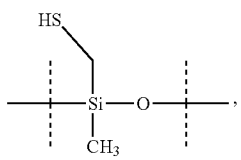

with a polymerization degree of approximately 20 and a weight percentage of approximately 45%, and the number of the siloxane units in

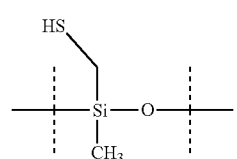

may account for approximately 40% of the total number of the siloxane repeating units; and component (iii) 2,4,6-trichloro-s-triazine, a weight percentage of approximately 5%.

Example 2

Testing of Organic Light-Emitting Display Panels certain testing is performed on the first to seventh disclosed display panels and the first to third reference display panels, such as curing shrinkage, light renaissance, water permeability, surface tension.

In particular, in the curing shrinkage testing, the volume shrinkage is calculated based on the thickness change of the sample before and after curing, i.e., the curing shrinkage=thickness shrinkage/the original thickness. In the curing shrinkage testing, the light transmittance refers to a ratio of the light transmittance of the glass substrate disposed with the photo-curved sample over the light transmittance of the same glass substrate.

The water permeability was tested by water vapor transmission rate (WVTR) Standard Test Method, by adopting Mocon AQUATRAN® MODEL 2 under 100% RH and room temperature. The surface tension was tested by the dropping method, also called the drop volume method.

Table 1 illustrates the testing results of the first to seventh disclosed display panels and the first to third reference display panels.

TABLE 1

Testing results of the first to seventh disclosed display panels and the first to third reference display panels

| | Water permeability WVTR (g/[m$^2$-day]) | Light transmittance (%) | Curing shrinkage (%) | Surface tension (dyn/cm) |
| --- | --- | --- | --- | --- |
| First disclosed display panel | 0.0005 | 98 | 0.8 | 26 |
| Second disclosed display panel | 0.0006 | 97 | 0.8 | 27 |
| Third disclosed display panel | 0.0010 | 95 | 0.9 | 24 |
| Fourth disclosed display panel | 0.0009 | 96 | 0.8 | 24 |
| Fifth disclosed display panel | 0.0004 | 95 | 0.9 | 25 |
| Sixth disclosed display panel | 0.0001 | 99 | 0.9 | 27 |
| Seventh disclosed display panel | 0.0006 | 97 | 0.8 | 26 |
| First reference display panel | 0.0004 | 88 | 0.8 | 20 |
| Second reference display panel | 0.1000 | 92 | 0.8 | 15 |
| Third reference display panel | 0.0040 | 97 | 1.2 | 20 |

As shown in Table 1, when the polymerization degree exceeds 100 (i.e., the first reference display panel), compared to the first disclosed display panel, the light transmittance and the surface tension decreases, while the water permeability substantially remains the same. That is, a higher polymerization degree may degrade the light transmittance of the encapsulation layer and, accordingly, degrade the light transmittance of the organic light-emitting display panel.

Compared to the acrylic organic layer (i.e., the second reference display panel), the first to seventh disclosed display panels exhibit lower water permeability, higher light transmittance and smaller curing shrinkage.

Further, in the polyorganosiloxane, when the proportion of the photo-curable functional groups is less than 50% (i.e., the third reference display panel), the water permeability is increased, i.e., the water resistance may be degraded. Meanwhile, the curing shrinkage is increased and the surface tension is also reduced.

In the disclosed embodiments, an encapsulation layer having a polymer network formed by crosslinking the polyorganosiloxane may be introduced in the organic light-emitting display panel. The siloxane bond of the polyorganosiloxane has a larger angle than carbon-carbon bond, leading to an easy rotation. Thus, the formed polymer network may have a desired degree of elasticity and toughness, and the encapsulation layer based on the polyorganosiloxane may exhibit a desired shock resistance. Thus, the reliability of the organic light-emitting display panel may be enhanced.

Further, the polymer network formed by crosslinking the polyorganosiloxane may have light transmittance higher than approximately 98%, which may facilitate the photo curing. Meanwhile, the polymer network formed by cross-linking the polyorganosiloxane may also have good shock resistance, thermal resistance and yellowing resistance, and low surface tension.

According to the present disclosure, by selecting desired material, a material having high temperature resistance, high light transmittance and yellowing resistance may be obtained for the organic, light-emitting display panel, without changing the existing inkjet printing process.

It should be noted that, the first to the seventh disclosed display panels provided in the present disclosure are for illustrative purposes, illustrating that the encapsulation layer having a polymer network formed by crosslinking the polyorganosiloxane may exhibit desired water barrier properties, light transmittance and curing shrinkage to improve the performance of the corresponding organic light-emitting display panel. Any appropriate encapsulation layer having a polymer network formed by crosslinking the polyorganosiloxane may fall within the scope of the present disclosure.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An organic light-emitting display panel, comprising:
a substrate;
an organic light-emitting device disposed on a side of the substrate, wherein the organic light-emitting device has a first side facing the substrate and an opposing side; and
an encapsulation layer disposed on the opposing side of the organic light-emitting device, wherein the encapsulation layer includes at least one organic encapsulation layer, and the at least one organic encapsulation layer includes a polymer network of cross-linked polyorganosiloxane formed by cross-linking at least one component (i) polyorganosiloxane having a block structure of the following chemical formula (Q-1) with at least one component (ii) polyorganosiloxane having a block structure of the following chemical formula (Q-2),

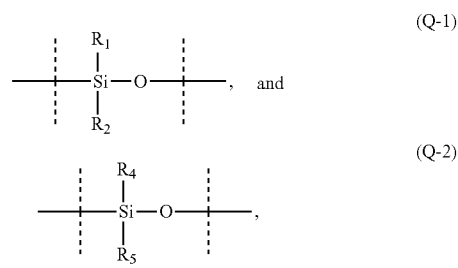

wherein in the chemical formula (Q-1) and chemical formula (Q-2),
at least one of $R_1$ and $R_2$ is a photo-curable functional group comprising one of

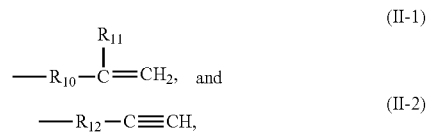

wherein $R_{10}$ and $R_{12}$ each is selected from a substituted or unsubstituted alkylene, the alkylene is a group has two hydrogens removed from a corresponding hydrocarbon, and $R_{11}$ is a substituted or unsubstituted hydrocarbon;
one of $R_4$ and $R_5$ is a mercaptoalkyl comprising $R_4'$—S—H and $R_5'$—S—H, respectively, wherein $R_4'$ is an alkyl corresponding to $R_4$ and $R_5'$ is an alkyl corresponding to $R_5$;
each of un-crosslinked $R_1$ and un-crosslinked $R_2$ is selected from a group consisting of hydrogen, a substituted or unsubstituted hydrocarbon, a substituted or unsubstituted aromatic base, and a substituted or unsubstituted polysiloxane, and
when one of $R_4$ and $R_5$ is a mercaptoalkyl, the other of $R_4$ and $R_5$ includes at least one selected from or a combination of at least two selected from hydrogen, a substituted or unsubstituted hydrocarbon, a substituted or unsubstituted polysiloxane, and a photo-curable functional group, and
wherein the polymer network of cross-linked polyorganosiloxane at least includes a chemical structure of

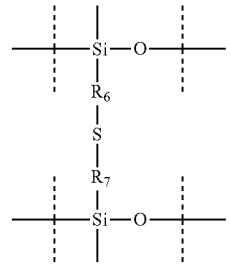

formed by a photo-curing reaction between the photo-curable functional group and the mercaptoalkyl, wherein includes one of

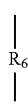

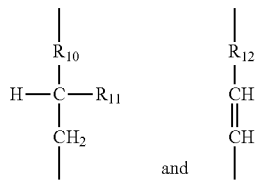

and $R_7$ includes one of $R_4'$ and $R_5'$.

2. The organic light-emitting display panel according to claim 1,
wherein:
in the component (i) polyorganosiloxane, a number of substituted siloxane repeating units having the photo-curable functional group accounts for approximately more than 50% of a total number of the siloxane repeating units to provide the encapsulation material with increased flexibility and light transmission; and
in the component (ii) polyorganosiloxane, a number of substituted siloxane repeating units having mercaptoalkyl accounts for approximately more than 50% of a total number of the siloxane repeating units.

3. The organic light-emitting display panel according to claim 1,
wherein:
each of the un-crosslinked $R_1$ and the un-crosslinked $R_2$ is selected from a group consisting of hydrogen, a substituted or unsubstituted $C_1$-$C_6$ alkyl, a substituted or unsubstituted $C_6$ to $C_{12}$ aryl; and
the mercaptoalkyl is a substituted or unsubstituted $C_1$ to $C_{10}$ mercaptoalkyl.

4. The organic light-emitting display panel according to claim 3,
wherein:
the photo-curable functional group is selected from a group consisting of vinyl, allyl, alkenyl,

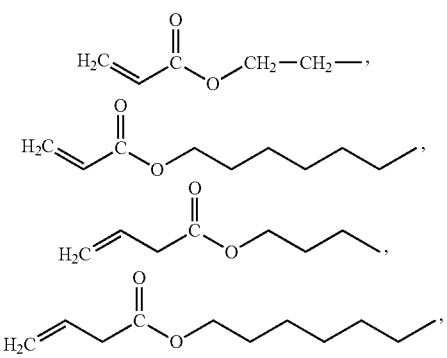

ethynyl, propargyl, acetylene, 2-methylallyl, and 2-methylpentyl.

5. The organic light-emitting display panel according to claim 1,
wherein:
the at least one organic encapsulation layer has a thickness of approximately 1 to 20 μm.

6. The organic light-emitting display panel according to claim 1,
wherein the encapsulation layer includes:
the at least one organic encapsulation layer and at least one inorganic encapsulation layer alternately disposed,
wherein a layer which is disposed closest to the organic light-emitting device is the at least one organic encapsulation layer to provide the organic light-emitting display panel with increased flexibility.

7. The organic light-emitting display panel according to claim 6,
wherein:
the at least one organic encapsulation layer includes a first organic encapsulation layer and a second organic encapsulation layer, and
the encapsulation layer includes the first organic encapsulation layer, a first inorganic encapsulation layer, and the second organic encapsulation layer sequentially disposed on the side of the organic light-emitting display panel.

8. The organic light-emitting display panel according to claim 1,
wherein the encapsulation layer includes:
the at least one organic encapsulation layer and at least one inorganic encapsulation layer alternately disposed,
wherein a layer which is disposed closest to the organic light-emitting device is the at least one inorganic encapsulation layer.

9. The organic light-emitting display panel according to claim 8,
wherein:
the at least one organic encapsulation layer includes a first organic encapsulation layer and a second organic encapsulation layer, and
the encapsulation layer includes the first inorganic encapsulation layer, a first organic encapsulation layer, and the second inorganic encapsulation layer sequentially disposed on the side of the organic light-emitting display panel.

10. The organic light-emitting display panel according to claim 6,
wherein:
the at least one inorganic encapsulation layer has a thickness smaller than approximately 1 μm; and
the at least one inorganic encapsulation layer includes at least one of metal oxide, metal nitride, metal carbide, and metal oxynitride.

11. The organic light-emitting display panel according to claim 10,
wherein:
the at least one inorganic encapsulation layer includes silicon nitride or aluminum oxide.

12. The organic light-emitting display panel according to claim 1,
the polyorganosiloxane component (i) has a polymerization degree of 1 to 100, and
the polyorganosiloxane component (ii) has a polymerization degree of 1 to 100.

13. An organic light-emitting display panel, comprising:
a substrate;
an organic light-emitting device disposed on a side of the substrate, wherein the organic light-emitting device has a first side facing the substrate and an opposing side; and an encapsulation layer disposed on the opposing side of the organic light-emitting device, wherein the encapsulation layer includes at least one organic encapsulation layer, and the at least one organic encapsulation layer includes a polymer network of cross-linked polyorganosiloxane formed by cross-linking at least one component (i) polyorganosiloxane having a block structure of the following chemical formula (Q-1) with at least one component (ii) polyorganosiloxane having a block structure of the following chemical formula (Q-2),

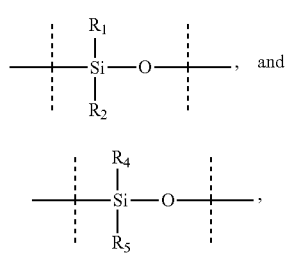, and (Q-1)

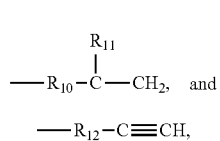, (Q-2)

wherein in the chemical formula (Q-1) and chemical formula (Q-2),
at least one of $R_1$ and $R_2$ is a photo-curable functional group comprising one of —$R_{10}$—$\overset{\overset{R_{11}}{|}}{C}$—$CH_2$, and (II-1)

—$R_{12}$—C≡CH, (II-2)

wherein $R_{10}$ and $R_{12}$ each is selected from a substituted or unsubstituted alkylene, the alkylene is a group has two hydrogens removed from a corresponding hydrocarbon, and $R_{11}$ is a substituted or unsubstituted hydrocarbon;
each of $R_4$ and $R_5$ is a mercaptoalkyl comprising $R_4'$—S—H and $R_5'$—S—H, respectively, wherein $R_4'$ is an alkyl corresponding to $R_4$ and $R_5'$ is an alkyl corresponding to $R_5$;

each of un-crosslinked $R_1$ and un-crosslinked $R_2$ is selected from a group consisting of hydrogen, a substituted or unsubstituted hydrocarbon, a substituted or unsubstituted aromatic base, and a substituted or unsubstituted polysiloxane, and wherein the polymer network of cross-linked polyorganosiloxane at least includes a chemical structure of

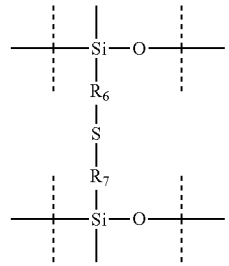

formed by a photo-curing reaction between the photo-curable functional group and the mercaptoalkyl, wherein

includes one of

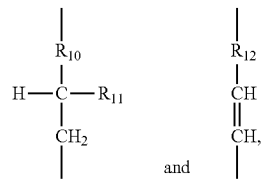

and $R_7$ includes one of $R_4'$ and $R_5'$.

* * * * *